(12) United States Patent
Lee et al.

(10) Patent No.: US 8,134,291 B2
(45) Date of Patent: Mar. 13, 2012

(54) ELECTROLUMINESCENT DEVICE AND METHOD FOR PREPARING THE SAME

(75) Inventors: Tae-Woo Lee, Seoul (KR); Sang-Yeol Kim, Gwacheon-si (KR); Jong-Jin Park, Guri-si (KR); Mu-Gyeom Kim, Hwaseong-si (KR); Lyong-Sun Pu, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 626 days.

(21) Appl. No.: 12/155,842

(22) Filed: Jun. 10, 2008

(65) Prior Publication Data

US 2009/0021153 A1    Jan. 22, 2009

Related U.S. Application Data

(63) Continuation-in-part of application No. 11/287,433, filed on Nov. 28, 2005, now abandoned.

(30) Foreign Application Priority Data

Jan. 7, 2005   (KR) .................. 10-2005-0001670

(51) Int. Cl.
*H01J 1/62*   (2006.01)
*H01J 63/04*   (2006.01)
(52) U.S. Cl. ........................... 313/504; 313/506
(58) Field of Classification Search ............ 313/504, 313/506
See application file for complete search history.

(56) References Cited

U.S. PATENT DOCUMENTS 5,473,448 A   12/1995 Yoshinaga et al.
5,936,347 A * 8/1999 Isaka et al. .................. 313/509

(Continued)

FOREIGN PATENT DOCUMENTS

JP    1999283751    10/1999

(Continued)

OTHER PUBLICATIONS

Office action from the Chinese Patent Office issued in Applicant's corresponding Chinese Patent Application No. 2005101297711 dated Oct. 31, 2008.

(Continued)

*Primary Examiner* — Nimeshkumar Patel
*Assistant Examiner* — Anthony Perry
(74) *Attorney, Agent, or Firm* — Robert E. Bushnell, Esq.

(57) ABSTRACT

An electroluminescent device comprises a substrate, a first electrode, a second electrode, and an organic layer disposed between the first electrode and the second electrode, and including at least a light-emitting layer. A metal nano pattern which enables emission of polarized light is provided on one surface of at least one of the first electrode and the second electrode, wherein a grating period of the metal nano pattern satisfies the relation of Formula 1 below. A method of preparing the electroluminescent device comprises providing a substrate, first and second electrodes, and an organic layer including a light-emitting layer, with a metal nano pattern being provided on at least one of the first and second electrodes. Formula 1 is described in more detail in the description of the invention. The electroluminescent device can achieve emission of polarized light, without reforming materials used in forming the organic layer.

$$D < \frac{\lambda}{n_o + n_i \sin\theta_i} \quad \text{Formula 1}$$

3 Claims, 5 Drawing Sheets

U.S. PATENT DOCUMENTS

| | | | |
|---|---|---|---|
| 6,117,529 | A | 9/2000 | Leising et al. |
| 6,396,208 | B1 | 5/2002 | Oda et al. |
| 6,476,550 | B1 | 11/2002 | Oda et al. |
| 6,489,044 | B1 | 12/2002 | Chen et al. |
| 6,579,564 | B2 | 6/2003 | Chen et al. |
| 6,649,283 | B1 | 11/2003 | Lupo et al. |
| 6,650,047 | B2 | 11/2003 | Aoki et al. |
| 6,777,531 | B2 | 8/2004 | Yasuda et al. |
| 2002/0164415 | A1 | 11/2002 | Van Der Schaft et al. |
| 2003/0057417 | A1 | 3/2003 | Lee et al. |
| 2003/0062520 | A1* | 4/2003 | Toguchi et al. .......... 257/40 |
| 2005/0026530 | A1 | 2/2005 | Toguchi et al. |
| 2005/0082539 | A1 | 4/2005 | Fujimoto et al. |

FOREIGN PATENT DOCUMENTS

JP  2003115377  4/2003

OTHER PUBLICATIONS

Japanese Office Action issued by JPO, dated Feb. 22, 2011, corresponding to Japanese Patent Application No. 2005-373537, together with Request for Entry.

Korean Office Action issued by KIPO, dated Mar. 30, 2011, corresponding to Korean Patent Application No. 10-2005-0001670, together with Request for Entry.

* cited by examiner

ELECTROLUMINESCENT DEVICE AND METHOD FOR PREPARING THE SAME

CROSS-REFERENCE TO RELATED APPLICATIONS

This application is a Continuation-in-Part of Applicants' patent application Ser. No. 11/287,433 filed in the U.S. Patent & Trademark Office on the 28 Nov. 2005, now abandoned and assigned to the assignee of the present invention. All benefits accruing under 35 U.S.C. §120 from the parent application are also hereby claimed.

CLAIM OF PRIORITY

This application makes reference to, incorporates the same herein, and claims all benefits accruing under 35 U.S.C. §119 from an application for Electroluminescent Device and Method for Preparing the Same earlier filed in the Korean Intellectual Property Office on the 7 Jan. 2005 there duly assigned Serial No. 10-2005-0001670.

BACKGROUND OF THE INVENTION

1. Technical Field

The present invention relates to an electroluminescent device and a method for preparing the same and, more particularly, to an electroluminescent device which can achieve emission of polarized light without reforming materials used to form organic layers by including a metal nano pattern having a grating period which enables emission of polarized light, and a method for preparing the same.

2. Description of the Related Art

An electroluminescent device, specifically, an organic electroluminescent device (organic EL device) is a self-emissive display that emits light by recombination of electrons and holes in a fluorescent or phosphorescent organic layer when a current is applied to the organic layer. Organic ELs are lightweight, have simple constituent elements, are easily fabricated, and have superior image quality and a wide viewing angle. In addition, organic EL devices have electrical properties suitable for portable electronic equipment, such as complete creation of moving pictures, high color purity, low power consumption, low voltage driving, and so forth. The organic electroluminescent device can be used in applications in a wide variety of fields, such as display devices, backlight units and the like.

Particularly, research efforts directed at achieving polarized electroluminescence are actively being conducted.

U.S. Pat. No. 6,777,531 B2 discloses polyfluorene, end-capped with at least one charge-transporting moiety, as a material forming an emission layer in an organic electroluminescent device, and devices having the same. In this patent, it is taught that a material for an alignment layer is directly rubbed to achieve polarized electroluminescence.

U.S. Pat. No. 6,649,283 B2 discloses layers comprising polyimide and organic functional material such as hole transport material, electron transport material and/or emitter material, the layers being prepared by mixing the functional material with a polyimide precursor material, forming a thin film out of the mixture, and converting said mixture into doped polyimide. The referenced patent describes a method of obtaining polarized emission which includes rubbing a polyimide-based material and aligning a polymeric liquid crystalline material on the rubbed polyimide-based material.

U.S. Pat. Nos. 6,579,564 B2 and 6,489,044 B1 disclose a layer coated with a friction transferred alignment material so as to have alignment properties, and a device comprising the same. According to these patents, polarized emission is achieved by preparing an alignment layer deposited by a friction transfer method and coating an electroluminescent layer on the alignment layer.

In the conventional electroluminescent devices proposed in the patents discussed above, in order for the proposed devices to emit polarized light, organic layer forming materials need to be converted. However, organic layers are derived from numerous kinds of materials. Thus, it is quite a big challenge to convert such organic layer forming materials into emissive materials. Accordingly, there is a need for development of electroluminescent devices enabling emission of polarized light without reforming the materials used to form organic layers.

SUMMARY OF THE INVENTION

Therefore, to solve the foregoing and/or other problems of the related art, the present invention provides an electroluminescent device which can achieve emission of polarized light without reforming materials used in forming organic layers by including a metal nano pattern having a grating period which enables emission of polarized light, and a method for preparing the same.

According to an aspect of the present invention, an electroluminescent device comprises a substrate, a first electrode, a second electrode, and an organic layer disposed between the first electrode and the second electrode and including at least a light-emitting layer, wherein a metal nano pattern which enables emission of polarized light is provided on one surface of at least one of the first electrode and the second electrode, and wherein a grating period of the metal nano pattern satisfies the relation of Formula 1 below:

$$D < \frac{\lambda}{n_o + n_i \sin\theta_i} \quad \text{Formula 1}$$

wherein D is a grating period of the metal nano pattern;
λ is a wavelength of light emitted from the organic layer;
$n_i$ is a refraction index of the incident medium of the light emitted from the organic layer;
$n_o$ is a refraction index of the transmitted medium of the light emitted from the organic layer; and
$\theta_i$ is an angle of incidence of the light emitted from the organic layer which is incident on the metal nano pattern.

According to another aspect of the present invention, an electroluminescent device comprises a substrate, an electrode, an organic layer including at least a light-emitting layer, and a metal nano pattern which enables emission of polarized light, which is shaped as stripes, and which functions as an counter electrode, wherein a grating period of the metal nano pattern satisfies the relation of Formula 1 above:

According to still another aspect of the present invention, an electroluminescent device comprises a substrate, an electrode, an organic layer including at least a light-emitting layer, a metal nano pattern which enables emission of polarized light and which functions as an counter electrode, and a soft substrate, wherein a plurality of protrusions and recesses are provided on one surface of the soft substrate, wherein the metal nano pattern is formed in accordance with the protrusions and recessions, and wherein a grating period of the metal nano pattern satisfies the relation of Formula 1 above.

According to the present invention, the electroluminescent device includes a metal nano pattern having a grating period which enables emission of polarized light, and thus can achieve emission of polarized light without reforming materials used to form organic layers.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
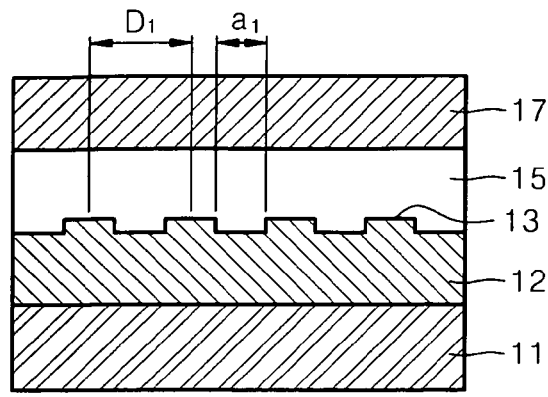
FIGS. 1 thru 10 schematically illustrate exemplary embodiments of an electroluminescent device configurations of the present invention.

Reference will now be made in detail to the preferred embodiments of the present invention, examples of which are illustrated in the accompanying drawings.

An electroluminescent device according to an embodiment of the present invention comprises a substrate, a first electrode, a second electrode, and an organic layer disposed between the first electrode and the second electrode and including at least a light-emitting layer, wherein a metal nano pattern is provided on one surface of at least one of the first electrode and the second electrode.

In this regard, a grating period of the metal nano pattern satisfies the relation of Formula 1 below:

$$D < \frac{\lambda}{n_o + n_i \sin\theta_i} \quad \text{Formula 1}$$

In Formula 1, D is a grating period of the metal nano pattern.

In Formula 1, λ is a wavelength of light emitted from the organic layer.

The value of λ varies according to the material used to form the organic layer. For example, if a red emitting material is used, λ may range from 600 nm to 690 nm. If a green emitting material is used, λ may range from 500 nm to 530 m, and if a blue emitting material is used, λ may range from 430 nm to 460 nm. However, the ranges are provided as a rough guide only and are not limited thereto.

In Formula 1, $n_i$ is a refraction index of the incident medium of the light emitted from the organic layer and $n_o$ is a refraction index of the transmitted medium of the light emitted from the organic layer. That is, $n_i$ is a refraction index of a material consisting of a layer which is adjacent to the metal nano pattern and positioned in the same direction of an emitting layer, and $n_o$ is a refraction index of a material consisting of a layer which is adjacent to the metal nano pattern and positioned in the opposite direction of an emitting layer.

For example, in an electroluminescent device including a substrate, a first electrode, a metal nano pattern, a hole injection layer, a hole transport layer, an emitting layer, an electron transport layer, an electron injection layer and a second electrode, all of which are sequentially stacked, $n_i$ is a refraction index of a material consisting of the hole injection layer and $n_o$ is a refraction index of the first electrode.

In another electroluminescent device including a substrate, a first electrode (reflective), an emitting layer, a metal nano pattern and a second electrode (transparent), all of which are sequentially stacked, $n_i$ is a refraction index of a material consisting of the emitting layer material and $n_o$ is a refraction index of the second electrode.

In another electroluminescent device, the refraction index of one of the plurality of organic layers may range from 1.5 to 2.0 which is a typical refraction index of an organic material.

In another electroluminescent device including a substrate, a metal nano pattern, a first electrode, a hole injection layer, a hole transport layer, an emitting layer, an electron transport layer, an electron injection layer and a second electrode, all of which are sequentially stacked, $n_i$ is a refraction index of the first electrode and $n_o$ is a refraction index of the substrate.

In another electroluminescent device including a substrate, a first electrode, a hole injection layer, a hole transport layer, an emitting layer, an electron transport layer, an electron injection layer, a second electrode and a metal nano pattern, all of which are sequentially stacked, $n_i$ is a refraction index of the second electrode and $n_o$ is a refraction index of an air.

If $n_i$ and $n_o$ are refraction indexes of the material used to form the first electrode and the second electrode, respectively, for example, ITO, $n_i$ and $n_o$ may be 1.8, which is the refraction index of ITO. If the first or second electrode is formed of metals, $n_i$ and $n_o$ may be determined in consideration of a complex refraction index thereof.

In Formula 1, $\theta_i$ is an angle of incidence of the light emitted from the organic layer which is incident on the metal nano pattern. Since light generated in the organic layer is radiated in all directions, $\theta_i$ may be a variable and range from 0° to 90°.

If the electroluminescent device includes the metal nano pattern having a grating period which satisfies Formula 1 above, light generated in the organic layer resonates in Reyleigh resonance conditions and is extracted out of the device, and thus reflecting polarizing or transmitting polarizing can be achieved. According to another embodiment of the invention, Formula I is replaced by Formula II below.

$$D < \lambda/(n_o + ni) \quad \text{Formula II}$$

When sin θi is 90°, Formula I can satisfy Formula II. If a grating period of the metal nano pattern satisfies the relation of Formula II, the electroluminescent device including the metal nano pattern can emit only a polarized light.

In the present invention, the term "metal nano pattern" is used to represent a pattern which enables a grating to be provided in a pathway of light generated in the organic layer. In this regard, the grating period of the metal nano pattern satisfies the relation of Formula 1 above. The shapes of the metal nano pattern will be described later with reference to FIGS. 1 thru 10.

The metal nano pattern is shaped so as to be capable of emitting polarized light. For example, the metal nano pattern is shaped as stripes parallel to each other, and has (but is not limited to) a rectangular or square cross-section.

A grating interval of the metal nano pattern may be less than the grating period of the metal nano pattern. The term "grating interval" is used to represent an interval between two adjacent gratings and will be described later with reference to FIGS. 1 thru 10.

The metal nano pattern may be made of a material capable of reflecting light, for example, a metal. More specifically, the metal nano pattern may be made of at least one material selected from the group consisting of Ag, Cu, Al, Mg, Pt, Pd, Au, Ni, Nd, Ir, Cr, Na, Cs, Ba, Li, Ca, Co, and alloys of these metals. Particularly, Au is more preferable.

The first electrode and the second electrode may be independently made of at least one material selected from the group consisting of Ag, Mg, Al, Pt, Pd, Au, Ni, Nd, Ir, Cr, Li, Ca, Ba, Cs, Na, Cu, Co, indium tin oxide (ITO), indium zinc oxide (IZO), tin oxide ($SnO_2$), zinc oxide (ZnO), indium oxide ($In_2O_3$), and alloys thereof. In addition, the first electrode and the second electrode may be independently made of a conductive polymer. The conductive polymer may be, but is not limited to, polyaniline, poly(3,4-ethylenedioxythiophene) (PEDOT), polypyrrole, or the like.

When the first electrode or the second electrode is used as an anode, it can be made of a material having a high work function, for example, Ag, Al, Pt, Pd, Au, Ni, Nd, Ir, Cr, Cu, Co, ITO, IZO, $SnO_2$, ZnO, $In_2O_3$, alloys thereof, polyaniline, PEDOT or polypyrrole. More specifically, when the anode is a transparent electrode, a material having excellent conductivity, such as ITO, IZO, $SnO_2$, ZnO, $In_2O_3$, polyaniline, PEDOT or polypyrrole, can be used. When the anode is a reflective electrode, the reflective layer is made of Ag, Al, Mg, Pt, Pd, Au, Ni, Nd, Ir, Cr or alloys of these metals, and the transparent electrode layer is then made of ITO, IZO, ZnO, $In_2O_3$, polyaniline, PEDOT or polypyrrole, which is then laminated on the reflective layer. In addition, various modifications may be effected.

When the first electrode or the second electrode is used as a cathode, it can be made of a material having a small work function so that electrons can be easily supplied to a light-emitting layer among organic layers. For example, the cathode can be made of at least one selected from the group consisting of Li, Ca, Ba, Cs, Na, Mg, Al, and Ag. More specifically, when the second electrode is a transparent electrode used as a cathode, an auxiliary electrode layer or bus electrode lines made of ITO, IZO, ZnO, $In_2O_3$, polyaniline, PEDOT or polypyrrole may be formed on a thin film made of Li, Ca, Ba, Cs, Na, Ag, Mg, or Al. When the second electrode is a reflective electrode, the cathode may have a double layer structure consisting of a layer made of Li, Ca, Ba, Cs, or Na, and a layer made of Au, Al, Pd, Pt, or Mg. In addition, various modifications may be effected.

The metal nano pattern may be integrally provided for the first electrode having the metal nano pattern or the second electrode having the metal nano pattern, as shown in FIG. 1, or may be provided discretely from the first electrode having the metal nano pattern or the second electrode having the metal nano pattern, as shown in FIGS. 2, 3, 4 and 5.

The metal nano pattern may be made from materials the same as or different from materials used to form the first electrode having the metal nano pattern, or may be made from materials used to form the second electrode having the metal nano pattern, which depends upon the process of forming the metal nano pattern.

Figure 2:
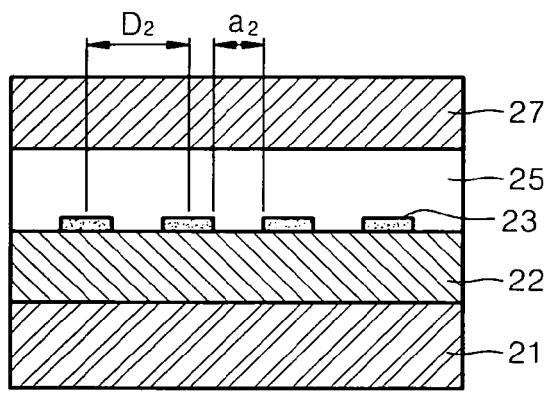
Figure 3:
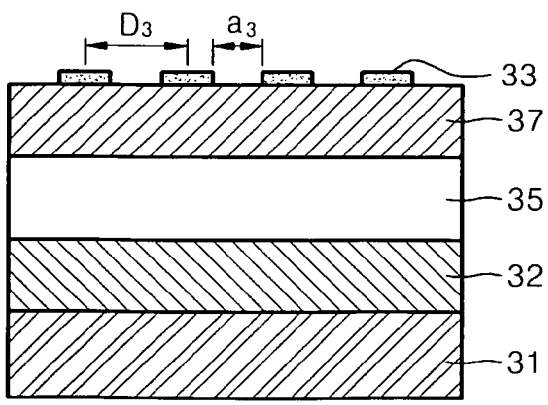
Figure 4:
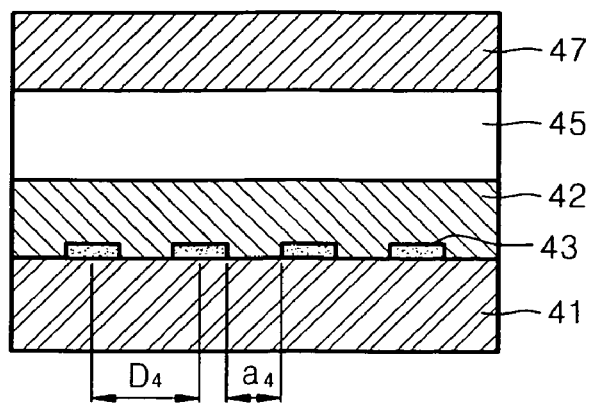
Figure 5:
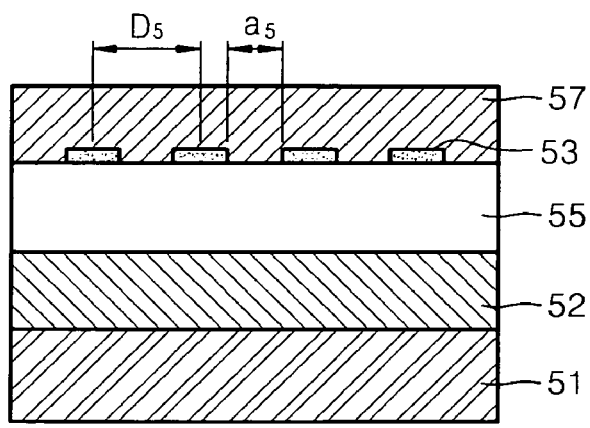

The metal nano pattern may protrude from the first electrode having the metal nano pattern or from the second electrode having the metal nano pattern, as shown in FIGS. 1, 2 and 3. In addition, the metal nano pattern may be recessed into the first electrode having the metal nano pattern or into the second electrode having the metal nano pattern, as shown in FIGS. 4 and 5.

In order to emit reflecting polarized light or transmitting polarized light, the metal nano pattern may be provided at various locations on the electroluminescent device according to the present invention. For example, the metal nano pattern may be provided between the first electrode and the organic layer. In addition, the metal nano pattern may be provided on one surface of the second electrode, rather than on the other surface of the second electrode facing the organic layer. Furthermore, the metal nano pattern may be provided between the first electrode and the substrate, or between the second electrode and the organic layer.

In another embodiment, an electroluminescent device comprises a substrate, an electrode, an organic layer including at least a light-emitting layer, and a metal nano pattern which enables emission of polarized light, is shaped as stripes, and functions as a counter electrode, wherein a grating period of the metal nano pattern satisfies the relation of Formula 1 above.

The metal nano pattern of the electroluminescent device according to the present embodiment may be shaped as stripes parallel to each other and function as an opposite electrode to the other electrode of the electroluminescent device, which will be described in more detail later with reference to FIGS. 6, 7 and 8.

The grating interval of the metal nano pattern may be less than the grating period of the metal nano pattern.

The metal nano pattern is required to enable emission of polarized light which satisfies the relation of Formula 1 above and to function as an electrode. Thus, the metal nano pattern may be made of Ag, Mg, Al, Pt, Pd, Au, Ni, Nd, Ir, Cr, Li, Ca, Ba, Cs, Na, Cu, Co, or the like.

In an electroluminescent device according to the present embodiment including a substrate, an electrode, an organic layer and a metal nano pattern which are sequentially stacked, a soft substrate may further be provided on the metal nano pattern.

In another embodiment, an electroluminescent device comprises: a substrate; an electrode; an organic layer including at least a light-emitting layer; a metal nano pattern which enables emission of polarized light and functions as a counter electrode; and a soft substrate, wherein a plurality of protrusions and recesses are provided on one surface of the soft substrate, wherein the metal nano pattern is formed in accordance with the protrusions and recesses, and wherein a grating period of the metal nano pattern satisfies the relation of Formula 1 above.

The metal nano pattern may be continuously (FIG. 9) or discontinuously (FIG. 10) formed on the plurality of protrusions and recesses provided on one surface of the soft substrate.

The grating interval of the metal nano pattern may be less than the grating period of the metal nano pattern.

The metal nano pattern may be made of at least one material selected from a group consisting of Ag, Mg, Al, Pt, Pd, Au, Ni, Nd, Ni, Cr, Li, Ca, Ba, Cs, Na, Cu and Co.

The soft substrate may be removed.

The organic layer of the electroluminescent device according to the present invention may include at least a light-emitting layer. The organic layer may further include at least one layer selected from the group consisting of a hole injection layer, a hole transport layer, an electron blocking layer, a hole blocking layer, an electron transport layer and an electron injection layer.

Since the electroluminescent device according to the present embodiment includes a metal nano pattern which enables emission of polarized light, emission of polarized light can be achieved without reforming materials used to form the organic layer.

In another embodiment, a method for preparing an electroluminescent device comprises the steps of providing a substrate, forming a first electrode having a metal nano pattern on the substrate, forming an organic layer including at least a light-emitting layer on the first electrode, and forming a second electrode on the organic layer.

In another embodiment, a method for preparing an electroluminescent device comprises the steps of providing a substrate, forming a first electrode on the substrate, forming an organic layer including at least a light-emitting layer on the first electrode, and forming a second electrode having a metal nano pattern on the organic layer.

In another embodiment, a method for preparing an electroluminescent device comprises the steps of providing a substrate, forming a metal nano pattern on the substrate, forming an organic layer including at least a light-emitting layer on the first electrode, and forming a second electrode on the organic layer.

In another embodiment, a method for preparing an electroluminescent device comprises the steps of providing a substrate, forming a first electrode on the substrate, forming an organic layer including at least a light-emitting layer on the first electrode, and forming a metal nano pattern on the organic layer.

There are a wide variety of methods for forming the metal nano pattern according to the present invention, and methods for forming the first electrode and/or the second electrode shaped as a metal nano pattern, and any known nano pattern forming technique can be used. Usable examples of the metal nano pattern forming technique include, but are not limited to, etching, micro contact printing (mCP), nano transfer printing (nTP), nano imprint lithography, cold welding, micro transfer molding, micro molding in capillaries, solvent-assisted micro molding, nano molding, and soft contact lamination.

Exemplary embodiments of the electroluminescent device according to the present invention and a method for preparing the same will now be described in greater detail with reference to FIGS. 1 thru 10. In the electroluminescent devices shown in FIGS. 1 thru 10, materials for forming a metal nano pattern, a grating period of the metal nano pattern, a grating interval of the metal nano pattern, materials for forming a first electrode, and materials for forming a second electrode are the same as discussed above.

The electroluminescent device shown in FIG. 1 includes a metal nano pattern 13 on one surface of a first electrode 12 disposed on a substrate 11, the metal nano pattern 13 being disposed between the first electrode 12 and an organic layer 15.

In detail, the electroluminescent device includes the substrate 11, as shown in FIG. 1. A variety of substrates commonly used for a general electroluminescent device, including a glass substrate, a transparent plastic substrate, and the like, can be used as the substrate 11 in consideration of transparency, surface smoothness, manageability, and waterproofness.

The first electrode 12 having the metal nano pattern 13 is formed on the substrate 11. The metal nano pattern 13 is integrally provided on the first electrode 12. The metal nano pattern 13 is made of the same material as that of the first electrode 12. In addition, the metal nano pattern 13 protrudes from the first electrode 12.

An organic layer 15 is provided on the first electrode 12 having the metal nano pattern 13. The organic layer 15 necessarily includes at least a light-emitting layer, and may optionally include at least one selected from the group consisting of a hole injection layer, a hole transport layer, an electron blocking layer, a hole blocking layer, an electron transport layer and an electron injection layer. Any known materials can be used to form the respective layers, and a variety of known deposition or coating techniques can be used to form the respective layers.

Examples of the light-emitting layer of the organic layer 15 include blue emitting materials such as oxadiazole dimer dyes (Bis-DAPOXP), spiro compounds (Spiro-DPVBi, Spiro-6P), triarylamine compounds, bis(styryl)amine (DPVBi, DSA), Flrpic, CzTT, Anthracene, TPB, PPCP, DST, TPA, OXD-4, BBOT, or AZM-Zn; green emitting materials such as Coumarin 6, C545T, Quinacridone), or Ir(ppy)$_3$, and red emitting materials such as DCM1, DCM2, Eu(thenoyltrifluoroacetone)3 (Eu(TTA)3), butyl-6-(1,1,7,7-tetramethyljulolidyl-9-enyl)-4H-pyran (DCJTB), or poly (MEH-PPV). Examples of the high molecular emitting material include, but are not limited to, polymers such as phenylenes, phenylene vinylenes, thiophenes, fluorenes and spiro-fluorenes, and nitrogen-containing aromatic compounds.

A second electrode 17 is provided on the organic layer 15. Materials for forming the second electrode 17 are the same as described above.

A grating period D1 of the metal nano pattern 13 of FIG. 1 satisfies Formula 1 above based on a wavelength of light generated in the organic layer 15, a refraction index of a material consisting of a layer which is formed on the metal nano pattern 13 and a refraction index of the first electrode 12. Thus, the electroluminescent device of FIG. 1 can emit polarized light. The grating interval a1 of the metal nano pattern 13 may be less than the grating period D1 of the metal nano pattern 13.

After forming the first electrode 12, the metal nano pattern 13 can be formed by any of a variety of nano pattern forming methods as described above. In one embodiment, the metal nano pattern 13 can be formed by a combination of a micro contact printing process and an etching process, which will be described in detail below with reference to FIG. 2.

Like the electroluminescent device shown in FIG. 1, the electroluminescent device shown in FIG. 2 includes a first electrode 22 disposed on a substrate 21, and a metal nano pattern 23 provided on one surface of the first electrode 22, specifically, between the first electrode 22 and an organic layer 25, the metal nano pattern 23 being provided discretely from the first electrode 22.

The metal nano pattern 23 may be made of a material different from that of the first electrode 22. For example, the metal nano pattern 23 may be made of Au, and the first electrode 22, which is a transparent electrode, may be made of ITO. The metal nano pattern 23 protrudes from the first electrode 22. A detailed explanation of an organic layer 25 and a second electrode 27 is the same as that set forth above with reference to organic layer 15 and second electrode 17 of FIG. 1.

A grating period D2 of the metal nano pattern 23 of FIG. 2 satisfies Formula 1 above based on a wavelength of light generated in the organic layer 25, a refraction index of a material consisting of a layer which is formed on the metal nano pattern 23 and a refraction index of the first electrode 22. Thus, the electroluminescent device of FIG. 2 can emit polarized light. The grating interval a2 of the metal nano pattern 23 may be less than the grating period D2 of the metal nano pattern 23.

After forming the first electrode 22, the metal nano pattern 23 can be formed by any of a variety of nano pattern forming methods as described above. In one embodiment, the metal nano pattern 23 can be formed by a combination of a micro contact printing process and an etching process.

The micro contact printing process can be used to form a self-assembly monolayer (to be referred to as a "SAM layer" hereinafter) having the nano pattern on a thin film made of a material forming the metal nano pattern 23. First, a master formed of a wafer, for example, is prepared. The master, which is used to fabricate a silicon polymer stamp with the nano pattern, has a predetermined nano pattern. Then, in order to fabricate the silicon polymer stamp, a silicon polymer forming solution is prepared. The silicon polymer forming solution is commercially available from various chemical companies. For example, Sylgard 184 series available from Dow Chemical, Inc. can be used to prepare the silicon polymer forming solution in order to obtain polydimethylsiloxane (PDMS) as a silicon polymer. The prepared silicon polymer forming solution is poured into the master, followed by curing the silicon polymer forming solution at an appropriate temperature, for example, at 60° C. to 80° C. for PDMS, thereby fabricating a silicon polymer stamp with the nano pattern. The silicon polymer stamp is formed so as to contact an SAM layer forming solution by various methods, and is then caused to contact a metal thin film, thereby forming an SAM layer having the nano pattern on the thin film.

After forming the SAM layer on a thin film made of a material forming the metal nano pattern in the above-described manner, a region of the thin film without the SAM layer is etched, followed by removal of the SAM layer, thereby completing formation of the metal nano pattern 23.

The electroluminescent device shown in FIG. 3 comprises a substrate 31, a first electrode 32, an organic layer 35 and a second electrode 37 sequentially stacked, wherein a metal nano pattern 33 is provided on one surface of the second electrode 37, specifically on the surface of the second electrode 37 opposite to the surface facing the organic layer 35.

The second electrode 37 may be a transparent electrode, and the metal nano pattern 33 is provided discretely on the second electrode 37. The metal nano pattern 33 may be made of a material different from that of the second electrode 37. The metal nano pattern 33 protrudes from the second electrode 37. A detailed explanation of the substrate 31 and the organic layer 35 is the same as that of the substrate 11 and organic layer 15 of FIG. 1.

The metal nano pattern 33 can be formed by any of a variety of nano pattern forming methods as described above. In one embodiment, the metal nano pattern 33 can be formed by a method the same as the method of forming the metal nano pattern 23 described above with reference to FIG. 2, except that the metal nano pattern 33 is formed on the second electrode 37.

A grating period D3 of the metal nano pattern 33 of FIG. 3 satisfies Formula 1 above based on a wavelength of light generated in the organic layer 35, a refraction index of the second electrode 37, and a refraction index of air. Thus, the electroluminescent device of FIG. 3 can emit polarized light. The grating interval a3 of the metal nano pattern 33 may be less than the grating period D3 of the metal nano pattern 33.

The electroluminescent device shown in FIG. 4 comprises a metal nano pattern 43 on one surface of a first electrode 42, specifically, between the first electrode 42 and a substrate 41.

The metal nano pattern 43 is provided discretely from the first electrode 42, and is made of a material different from that of the first electrode 42. The metal nano pattern 43 is recessed into the first electrode 42. A detailed explanation of the substrate 41 and the organic layer 45 is the same as that of the substrate 11 and organic layer 15 of FIG. 1.

The metal nano pattern 43 can be formed by any of a variety of nano pattern forming methods as described above. In one embodiment, the metal nano pattern 43 can be formed by a method the same as the method of forming the metal nano pattern 23 described above with reference to FIG. 2, except that the metal nano pattern 43 is formed on the substrate 41.

A grating period D4 of the metal nano pattern 43 of FIG. 4 satisfies Formula 1 above based on a wavelength of light generated in the organic layer 45, a refraction index of the first electrode 42, and a refraction index of the substrate 41. Thus, the electroluminescent device of FIG. 4 can emit polarized light. The grating interval a4 of the metal nano pattern 14 may be less than the grating period D4 of the metal nano pattern 14.

The electroluminescent device shown in FIG. 5 comprises a substrate 51, a first electrode 52, an organic layer 55, and a second electrode 57 having a metal nano pattern 53, wherein the metal nano pattern 53 is disposed between the second electrode 57 and the organic layer 55.

The metal nano pattern 53 is provided discretely on the second electrode 57, and is made of a material different from that of the second electrode 57. The metal nano pattern 53 is recessed into the second electrode 57. A detailed explanation of the substrate 51 and the organic layer 55 is the same as that of the substrate 11 and organic layer 15 of FIG. 1.

A grating period D5 of the metal nano pattern 53 of FIG. 5 satisfies Formula 1 above based on a wavelength of light generated in the organic layer 55, a refraction index of a material consisting of a layer which is formed under the metal nano pattern 53, and a refraction index of the second electrode 57. Thus, the electroluminescent device of FIG. 5 can emit polarized light. The grating interval a5 of the metal nano pattern 53 may be less than the grating period D5 of the metal nano pattern 53.

After forming the organic layer 55, the metal nano pattern 53 can be formed by any of a variety of nano pattern forming methods as described above. In one embodiment, the metal nano pattern 53 can be formed by a combination of a cold welding process and a soft contact lamination process.

In detail, a material for forming the metal nano pattern 53 is applied to the entire surface of the organic layer 55 to form a thin film (referred to as "A"). Next, a silicon polymer stamp with a nano pattern, for example, a PDMS stamp, or a glass stamp with a nano pattern, is prepared. A detailed explanation of the process for fabricating the silicon polymer stamp is the same as described above with reference to FIG. 2. The material for forming the metal nano pattern 53 is deposited entirely over the nano pattern of the silicon polymer stamp or the glass stamp, thereby preparing the silicon polymer stamp or glass stamp deposited with material made of the nano pattern (53) (referred to as "B").

Thereafter, a region "A" and a region "B" of the material for forming the metal nano pattern 53 are brought into contact with each other, and then the stamp is removed. Then, based on the principle of the cold welding process, the region "A" is removed from contact with the region "B" to thus form the metal nano pattern 53 on the organic layer 55. Thereafter, the material for forming the second electrode 57 is applied over the metal nano pattern 53.

Figure 6:
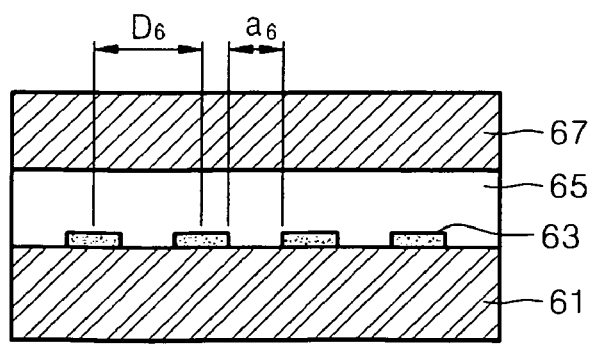

The electroluminescent device shown in FIG. 6 comprises a substrate 61, a metal nano pattern 63, an organic layer 65, and a second electrode 67. The metal nano pattern 63 is shaped as stripes, enables emission of polarized light, and functions as an opposite electrode. An exemplary method for forming the metal nano pattern 63 is the same as the method for forming the metal nano pattern 53 described above with reference to FIG. 5. The arrangement of FIG. 5, in which the metal nano pattern 53 is formed on the organic layer 55 followed by formation of the second electrode 57, is different from the arrangement of FIG. 6, in which the metal nano pattern 63 is formed on the substrate 61 followed by formation of the organic layer 65 and the metal nano pattern 63 functions as an electrode.

A grating period D6 of the metal nano pattern 63 of FIG. 6 satisfies Formula 1 above based on a wavelength of light generated in the organic layer 65, a refraction index of a material consisting of a layer which is formed on the metal nano pattern 63, and a refraction index of the substrate 61. Thus, the electroluminescent device of FIG. 6 can emit polarized light. The grating interval a6 of the metal nano pattern 63 may be less than the grating period D6 of the metal nano pattern 63.

Figure 7:
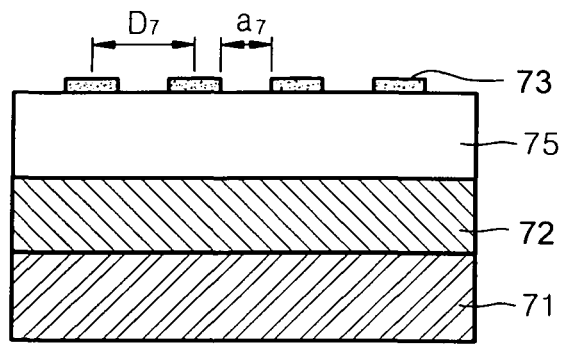

The electroluminescent device shown in FIG. 7 comprises a substrate 71, a first electrode 72, an organic layer 75, and a metal nano pattern 73. The metal nano patter 73 is shaped as stripes, enables emission of polarized light, and functions as a second electrode. An exemplary method of forming the metal nano pattern 73 is the same as that of forming the metal nano pattern 53 described above with reference to FIG. 5. The arrangement of FIG. 5, in which the metal nano pattern 53 is formed on the organic layer 55 followed by formation of the second electrode 57, is different from the arrangement of FIG. 7, in which the metal nano pattern 73 is formed on the organic layer 75 and functions as a second electrode.

A grating period D7 of the metal nano pattern 73 of FIG. 7 satisfies Formula 1 above based on a wavelength of light generated in the organic layer 75, a refraction index of a material consisting of a layer which is formed under the metal nano pattern 73, and a refraction index of air. Thus, the electroluminescent device of FIG. 7 can emit polarized light. The grating interval $a_7$ of the metal nano pattern 73 may be less than the grating period $D_7$ of the metal nano pattern 73.

In a modification of the electroluminescent device shown in FIG. 7, a soft substrate may further be provided on the metal nano pattern 73. In this case, a modification of the cold welding process used in forming the electroluminescent device shown in FIG. 5 may be employed. More specifically, a soft substrate is formed on a flat substrate, for example, a silicon wafer, and the thin film "A" (referred to above is connection with FIG. 5) is then formed on the soft substrate, followed by application of the cold welding process used in forming the electroluminescent device shown in FIG. 5, to form the metal nano pattern 73 on the soft substrate. The soft substrate having the metal nano pattern 73 is laminated on the organic layer 75 by a soft contact lamination process, thereby forming the metal nano pattern 73 on the organic layer 75. When the soft substrate is not removed after the formation of the metal nano pattern 73, an electroluminescent device having the soft substrate provided on the metal nano pattern 73 is obtained. This will be described in more detail later through Example 4.

Figure 8:
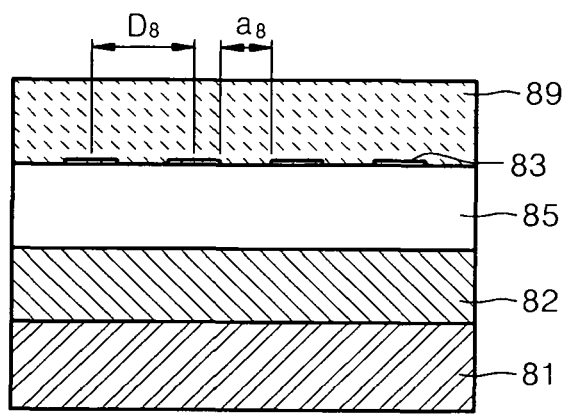

The electroluminescent device shown in FIG. 8 includes a substrate 81, a first electrode 82, an organic layer 85, a metal nano pattern 83 and a soft substrate 89. The metal nano pattern 83 may also function as a second electrode.

After forming the organic layer 85, the metal nano pattern 83 can be formed by any of a variety of nano pattern forming methods as described above. In one embodiment of forming the metal nano pattern 83, the metal nano pattern 83 is formed on a flat soft substrate 89, and is then subjected to a soft contact lamination process to allow the metal nano pattern 83 to make contact with the organic layer 85.

In detail, as the soft substrate 89, a flat base film, for example, a base film made of silicon polymer, is prepared. One example of the silicon polymer is PDMS. A thin film made of the same material as that of the metal nano pattern 83 is formed on one surface of the soft substrate 89, and then the thin film is patterned by a common photoresist patterning technique, thereby forming the metal nano pattern 83 on the soft substrate 89. Thereafter, the base film having the metal nano pattern 83 provided on its surface is disposed on the organic layer 85. In this regard, due to ductility of the soft substrate 89, the metal nano pattern 83 may be recessed into the soft substrate 89, and the soft substrate 89 may protrude with a height the same as that of the protrusions of the metal nano pattern 83 in some regions contacting the organic layer 85 as shown in FIG. 8. In addition, an extremely small air gap (not shown) may be created at a contact portion between the soft substrate 89 and the metal nano pattern 83. The soft substrate 89 may be optionally removed.

A grating period D8 of the metal nano pattern 83 of FIG. 8 satisfies Formula 1 above based on a wavelength of light generated in the organic layer 85, a refraction index of a material consisting of a layer which is formed under the metal nano pattern 83, and a refraction index of the soft substrate 89. Thus, the electroluminescent device of FIG. 8 can emit polarized light. The grating interval a8 of the metal nano pattern 83 may be less than the grating period D8 of the metal nano pattern 83.

Figure 9:
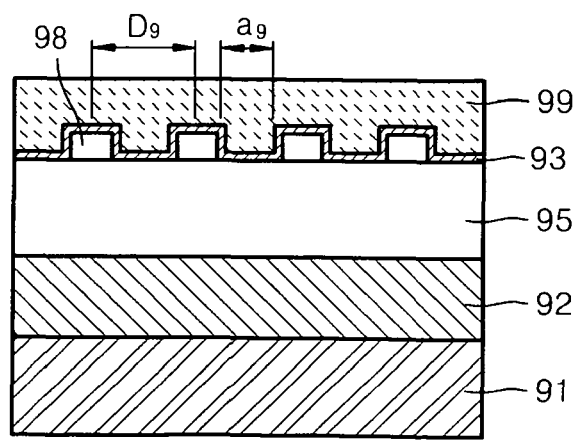

The electroluminescent device shown in FIG. 9 includes a substrate 91, a first electrode 92, an organic layer 95, a metal nano pattern 93, and a soft substrate 99. The metal nano pattern 93 is disposed between the soft substrate 99 and the organic layer 95. A plurality of protrusions and recesses are formed on a lower surface of the soft substrate 99, and the metal nano pattern 93 is continuously formed on the protrusions and recesses of the soft substrate 99. In addition, the metal nano pattern 93 functions as a second electrode.

The substrate 91 and the organic layer 95 are described with reference to FIG. 1

A grating period D9 of the metal nano pattern 93 of FIG. 9 satisfies Formula 1 above based on a wavelength of light generated in the organic layer 95, a refraction index of a material consisting of a layer which is formed under the metal nano pattern 93, and a refraction index of the soft substrate 99. Thus, the electroluminescent device of FIG. 9 can emit polarized light. The grating interval a9 of the metal nano pattern 93 may be less than the grating period D9 of the metal nano pattern 93.

The metal nano pattern 93 may be formed by any of a variety of nano pattern forming methods described above. In one embodiment, the metal nano pattern 93 can be formed in such a manner that a metal is deposited on the entire surface of a nano molded soft substrate 99, and is then subjected to soft contact lamination.

In detail, the soft substrate 99 is first provided for forming the metal nano pattern 93. The soft substrate 99 may be a silicon polymer stamp with a nano pattern, for example, a PDMS stamp. A detailed explanation of the method of fabricating the stamp is the same as that of the embodiment described above with reference to FIG. 2.

Next, a material forming the metal nano pattern 93 is deposited on the entire surface of the soft substrate 99. The deposition technique is not particularly limited to any specific method, and a variety of deposition techniques, including sputtering, e-beam deposition, thermal deposition, and so forth, can be used. Then, the soft substrate 99, on which the metal nano pattern 93 is formed, is deposited on the organic layer 95. In this respect, an air gap 98 may be created between the metal nano pattern 93 and the organic layer 95 as shown in FIG. 9. The soft substrate 99 can be optionally removed from the metal nano pattern 93.

Figure 10:
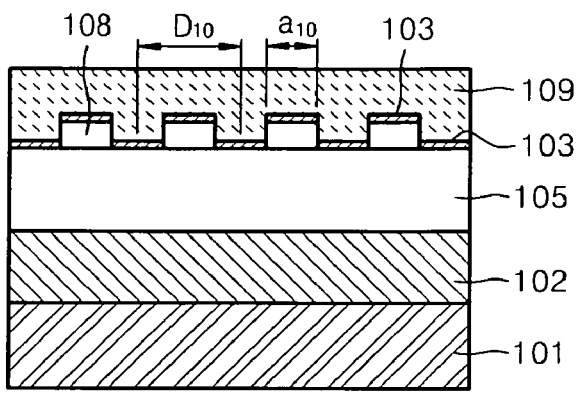

The electroluminescent device shown in FIG. 10 comprises a substrate 101, a first electrode 102, an organic layer 105, a metal nano pattern 103 and a soft substrate 109. The metal nano pattern 103 is disposed between the soft substrate 109 and the organic layer 105. A plurality of protrusions and recesses are formed on a lower surface of the soft substrate 109, and the metal nano pattern 103 is discontinuously formed on the protrusions and recesses of the soft substrate 109. In addition, the metal nano pattern 103 functions as a second electrode.

The metal nano pattern 103 can be formed by any of a variety of nano pattern forming methods as described above. In one embodiment, the metal nano pattern 103 can be formed in such a manner that a metal is partially deposited on a surface of a nano-molded soft substrate 109, and is then subjected to soft contact lamination.

In detail, the soft substrate 109 is first provided to form the metal nano pattern 103. The soft substrate 109 may be a silicon polymer stamp with a nano pattern, for example, a PDMS stamp. A detailed explanation of the method for fabricating the stamp is the same as that of the embodiment described above with reference to FIG. 2.

Next, a material for forming the metal nano pattern 103 is partially deposited on the soft substrate 109 with a nano pattern. The deposition technique is not particularly limited, and a variety of deposition techniques, including sputtering, e-beam deposition, thermal deposition, and so on, can be used.

Then, the soft substrate 109 on which the metal nano pattern 103 is formed is disposed on the organic layer 105. In this regard, an air gap 108 may be created between the metal nano pattern 103 and the organic layer 105, as shown in FIG. 10. The soft substrate 109 can be optionally removed.

The first electrodes and the second electrodes described above can function as an anode and a cathode, respectively, or vice versa. The present invention can be applied to a variety of types of electroluminescent devices. Particularly, when the invention is applied to an active matrix electroluminescent device, the first electrodes described above can be electrically connected to a drain or source electrode of a thin film transistor.

Electroluminescent devices fabricated in accordance with embodiments of the invention may be incorporated into a wide variety of applications, including backlight units of LCDs, and the like.

While the electroluminescent device according to the present invention and the methods of formation thereof have been described by various embodiments, with reference to FIGS. 1 through 10, it is understood that the various embodiments described herein are not intended to limit the scope of the invention. For example, although not illustrated in the drawings, in the case wherein the organic EL device of the present invention is used for bi-directional emission, a metal nano pattern may be provided on both first and second electrodes. Also, various modifications and variations can be made in the present invention.

Hereinafter, the present invention will be described in detail with reference to examples.

EXAMPLES

Example 1

To be used as a substrate and a first electrode, a glass substrate and ITO (available from Samsung Corning Co., Ltd.; sheet resistance: 15 Ω/cm$^2$; thickness: 1200 Å) were cut into a size of 50 mm×50 mm×0.7 mm and washed in isopropyl alcohol for 5 minutes and in pure water for 5 minutes by ultrasonic waves, and a UV/ozone washing was performed for 30 minutes, thereby preparing an ITO electrode. A thin film of Au was formed on the ITO electrode to a thickness of 20 nm. The thin film of Au was patterned by micro contact printing (mCP) and etching, thereby forming a Au nano pattern shaped as stripes on the ITO electrode. In this respect, the grating period of the Au nano pattern was 200 nm, and the grating interval of the Au nano pattern was 120 nm. The micro contact printing (mCP) and etching used for forming the Au nano pattern will now be described in more detail.

First, Sylgard 184A and Sylgard 184B (manufactured by Dow Corning Inc.) were mixed in a mixing vessel in a weight ratio of 10:1 to yield a PDMS forming solution. The resultant PDMS forming solution was poured into a master formed as a wafer. The master has a stripe-shaped nano pattern. Pores contained in the PDMS forming solution in the master were removed using a vacuum pump, the PDMS forming solution was then cured in an oven at a temperature of 60° C. to 80° C., and the master was removed, thereby obtaining a PDMS stamp. Observed results indicated that the nano pattern formed in the PDMS stamp had a grating period and a grating interval corresponding to those of the Au nano pattern to be fabricated later.

Thereafter, alkane thiolate powder was mixed with ethanol to give a 3 mM solution for use as a self-assembled monolayer (SAM) forming solution, followed by immersing the PDMS stamp in the SAM solution. The resultant PDMS stamp, coated with the SAM forming solution, was brought into contact with the thin film of Au, thereby forming an SAM layer having the same patterns as the Au nano pattern on the thin film of Au.

Then, Au present in a region other than the SAM layer was etched in a ferriferrocyanide etching bath containing 1 mM $K_4Fe(CN)_6$, 10 mM $K_3Fe(CN)_6$, 0.1 M $Na_2S_2O_3$, and 1.0 M KOH to then remove the SAM layer, thereby obtaining the Au nano pattern having the above-described grating period and grating interval.

Poly(9,9-dioctylfluorene-co-bis-N,N'-(4-butylphenyl)-bis-N,N'-phenyl-1,4-phenylenediamine as a hole transport material (PFB manufactured by Dow Chemical Co., Ltd.) was spin-coated on the ITO electrode having the Au nano pattern to form a 10 nm thick hole transport layer. A light-emitting layer having a thickness of 70 nm was formed on the hole transport layer using MEH-PPV (poly) as a red emitting material. BaF2 was deposited on the light-emitting layer to form an electron injection layer having a thickness of 4 nm. Ca was deposited on the resultant structure to a thickness of 2.7 nm and Al was then deposited thereon to a thickness of 250 nm to form a second electrode on the electron injection layer. The electroluminescent device shown in FIG. 2 was completed, which is referred to as sample 1.

Since MEH-PPV was used as an emitting material in sample 1, a wavelength of light emitted from the organic layer may be about 690 nm. Since PFB was used as a material used to form the hole injection layer which contacted the Au nano pattern, a refraction index of PFB was about 1.7 and a refractive index of ITO was about 1.8. Thus, the grating period of the Au nano pattern can satisfy Formula 1.

Example 2

To be used as a substrate and a first electrode, a glass substrate and ITO (available from Samsung Corning Co., Ltd.; sheet resistance: 15 Ω/cm$^2$; thickness: 1200 Å) were cut into a size of 50 mm×50 mm×0.7 mm and washed in isopropyl alcohol for 5 minutes and in pure water for 5 minutes by ultrasonic waves, and a UV/ozone washing was performed for 30 minutes. A light-emitting layer made of MEH-PPV (poly) as a red emitting material and having a thickness of 70 nm was formed on the ITO electrode. A second electrode (cathode) shaped as metal nano pattern was manufactured in the following manner by soft contact lamination.

First, Sylgard 184A and Sylgard 184B (manufactured by Dow Corning Inc.) were mixed in a mixing vessel in a weight ratio of 10:1 to yield a PDMS forming solution. The resultant PDMS forming solution poured into a master formed as a wafer. The master has a stripe-shaped nano pattern. Pores contained in the PDMS forming solution in the master were removed using a vacuum pump, the PDMS forming solution was then cured in an oven at a temperature of 60° C. to 80° C., and the master was removed, thereby obtaining a PDMS stamp.

Thereafter, Au was deposited on an entire surface of the PDMS stamp to form a thin film of Au having a thickness of 20 nm, and was patterned according to the nano pattern provided in the PDMS stamp, thereby forming an Au nano pattern. The grating period of the Au nano pattern was 200 nm, and the grating interval of the Au nano pattern was 120 nm.

Thereafter, the Au nano pattern was brought into contact with the light-emitting layer to form the Au nano pattern on the light-emitting layer, thereby completing the electroluminescent device shown in FIG. 9, which is referred to as sample 2.

Since MEH-PPV was used as an emitting material in sample 2, a wavelength of light emitted from the organic layer may be about 690 nm. In addition, a refraction index of MEH-PPV used to form the light-emitting layer which contacts the Au nano pattern was about 1.7 and a refractive index of ITO was about 1.8. Thus, the grating period of the Au nano pattern can satisfy Formula 1.

Example 3

To be used as a substrate and a first electrode, a glass substrate and ITO (available from Samsung Corning Co., Ltd.; sheet resistance: 15 Ω/cm$^2$; thickness: 1200 Å) were cut into a size of 50 mm×50 mm×0.7 mm and washed in isopropyl alcohol for 5 minutes and in pure water for 5 minutes by ultrasonic waves, and a UV/ozone washing was performed for 30 minutes. A light-emitting layer made of MEH-PPV (poly) as a red emitting material having a thickness of 70 nm was formed on the ITO electrode. An Au metal nano pattern having a grating period of 200 nm and a grating interval of 120 nm was manufactured in the following manner using cold welding and soft contact lamination.

First, Au was deposited on an entire surface of the light-emitting layer. Then, Sylgard 184A and Sylgard 184B (manufactured by Dow Corning Inc.) were mixed in a mixing vessel in a weight ratio of 10:1 to yield a PDMS forming solution. Meanwhile, a master shaped as a nano pattern (stripes) was prepared. The nano pattern master was provided on a silicon wafer and had a pattern corresponding to the Au nano pattern having the grating period of 200 nm and the grating interval of 120 nm. The PDMS forming solution was poured into the master shaped as a nano pattern (stripes). Thereafter, pores contained in the PDMS forming solution in the master were removed using a vacuum pump, the PDMS forming solution was then cured in an oven at a temperature of 60° C. to 80° C., and the master was removed, thereby obtaining a PDMS stamp with the nano pattern.

Thereafter, Ti was deposited on the PDMS stamp having the nano pattern derived from the nano pattern master to a thickness of 2 nm, and Au was entirely deposited thereon. The resultant structure was brought into contact with the Au thin film deposited on the entire surface of the light-emitting layer. Then, the PDMS stamp was removed to form an Au nano pattern (stripes) on the light-emitting layer based on the principle of the cold welding process. The grating period of the Au nano pattern was 200 nm, and the grating interval of the Au nano pattern was 120 nm. Therefore, the electroluminescent device shown in FIG. 7 was completed and referred to as sample 3.

Since MEH-PPV was used as an emitting material in sample 3, a wavelength of light emitted from the organic layer may be about 690 nm. In addition, a refraction index of MEH-PPV used to form the light-emitting layer which contacts the Au nano pattern was about 1.83 and a refractive index of PDMS was about 1.43. Thus, the grating period of the Au nano pattern can satisfy Formula 1.

Example 4

To be used as a substrate and a first electrode, a glass substrate and ITO (available from Samsung Corning Co., Ltd.; sheet resistance: 15 Ω/cm$^2$; thickness: 1200 Å) were cut into a size of 50 mm×50 mm×0.7 mm and washed in isopropyl alcohol for 5 minutes and in pure water for 5 minutes by ultrasonic waves, and a UV/ozone washing was performed for 30 minutes. A light-emitting layer made of MEH-PPV (poly) as a red emitting material and having a thickness of 70 nm was formed on the ITO electrode. An Au metal nano pattern having a grating period of 200 nm and a grating interval of 100 nm was manufactured in the following manner using cold welding and soft contact lamination.

First, Sylgard 184A and Sylgard 184B (manufactured by Dow Corning Inc.) were mixed in a mixing vessel in a weight ratio of 10:1 to yield a PDMS forming solution. Meanwhile, a plain silicon wafer without patterns and a stripe-shaped nano pattern master were prepared. The nano pattern master had a pattern corresponding to the Au nano pattern. The PDMS forming solution was poured into the plain silicon wafer and the nano pattern master, respectively. Thereafter, pores contained in the PDMS forming solution in the master were removed using a vacuum pump, the PDMS forming solution was then cured in an oven at a temperature of 60° C. to 80° C., and the master and the silicon wafer were removed, thereby obtaining a plain PDMS stamp without patterns and a PDMS stamp having a stripe-shaped nano pattern, respectively.

Next, Au was entirely deposited on the plain PDMS stamp without patterns. Then, Ti was entirely deposited on the PDMS stamp having the stripe-shaped nano pattern to a thickness of 2 nm and Au. The resultant PDMS stamps on which Au is deposited were adhered to each other such that Au of each of the PDMS contacted each other, thereby forming an Au nano pattern having a grating period of 200 nm and a grating interval of 100 nm on the plain PDMS stamp based on the principle of the cold welding process.

Thereafter, the PDMS stamp having the Au nano pattern was brought into contact with the light-emitting layer, thereby completing the electroluminescent device having an Au nano pattern having a grating period of 200 nm and a grating interval of 100 nm and a PDMS stamp formed on the Au nano pattern, as described in the modification of the EL device shown in FIG. 7, which is referred to as sample 4.

Evaluation Example

Figure 11:
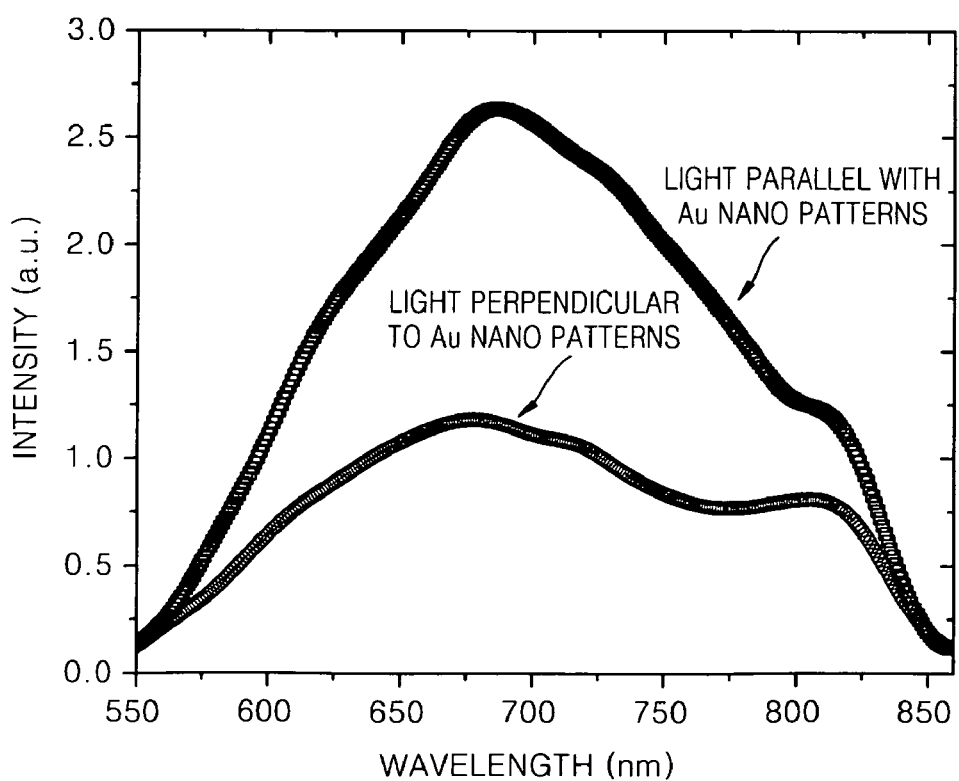
FIGS. 11 and 12 are graphs showing polarizing performance evaluation data of electroluminescent devices according to the present invention.
Figure 12:
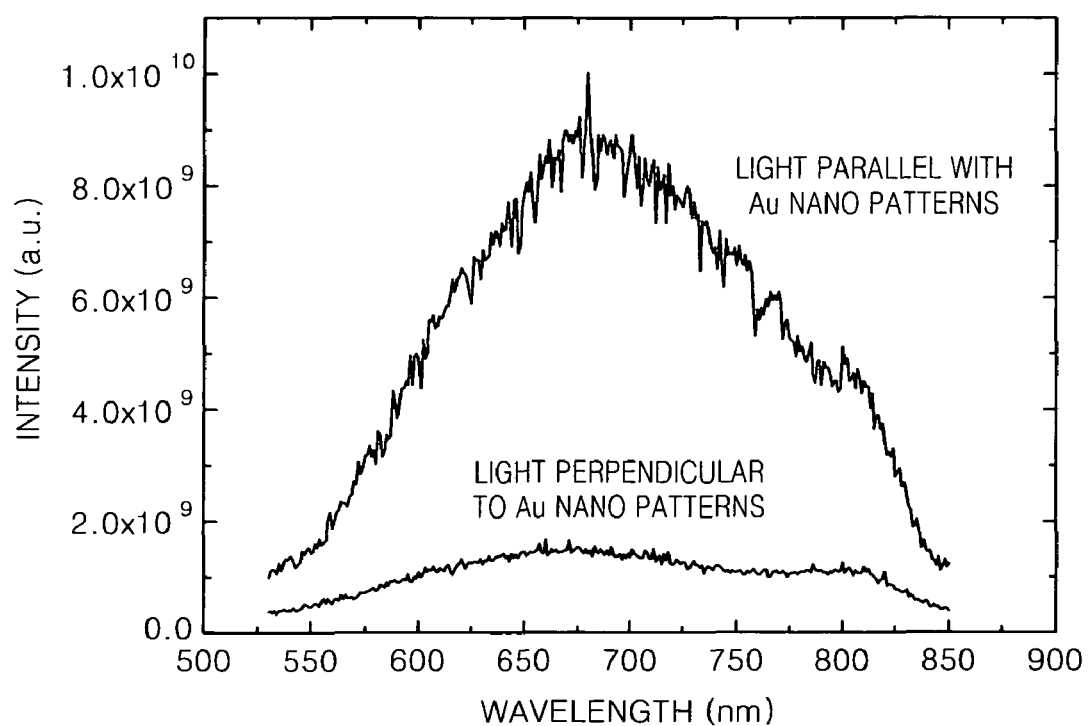

To evaluate polarizing performance, photoluminescent intensities of the samples 1 and 2 were measured, and the results thereof are shown in FIGS. 11 and 12, respectively. The polarizing performance was evaluated using a photoluminescence spectroscopic device having a polarizing film.

Referring to FIG. 11, it was found that the light intensity of light parallel to the Au nano pattern was higher than that of light perpendicular to the Au nano pattern. Particularly, the light parallel to the Au nano pattern of the sample 2 was approximately 2.5 times the light perpendicular to the Au nano pattern around 670 nm.

Referring to FIG. 12, it was found that the intensity of light parallel to the Au nano pattern was higher than that of light perpendicular to the Au nano pattern. Particularly, the light parallel to the Au nano pattern of the sample 2 was approximately 6 times the light perpendicular to the Au nano pattern around 670 nm.

As described above, in the electroluminescent device according to the present invention, since a metal nano pattern is provided on at least one of a first electrode and a second electrode, or at least one of the first electrode and the second electrode are shaped as a metal nano pattern, emission of polarized light can be achieved regardless of the materials used to form an organic layer.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An electroluminescent device, comprising:
a substrate;
an electrode;
an organic layer including at least a light-emitting layer;
a metal nano pattern which enables emission of polarized light, is shaped as stripes, and functions as an opposite electrode; and
a soft substrate, wherein a plurality of protrusions and recesses are provided on one surface of the soft substrate, wherein the metal nano pattern is formed on the protrusions and recesses, and wherein a grating period of the metal nano pattern satisfies the relation of Formula 1 below:

$$D < \frac{\lambda}{n_o + n_i \sin\theta_i} \qquad \text{Formula 1}$$

wherein
D is a grating period of the metal nano pattern;
$\lambda$ is a wavelength of light emitted from the organic layer;
$n_i$ is a refraction index of an incident medium of the light emitted from the organic layer;
$n_o$ is a refraction index of a transmitted medium of the light emitted from the organic layer; and
$\theta_i$ is an angle of incidence of the light emitted from the organic layer which is incident on the metal nano pattern;
wherein the metal nano pattern is discontinuously formed on the plurality of protrusions and recesses provided on said one surface of the soft substrate.

2. The electroluminescent device of claim 1, wherein a grating interval of the metal nano pattern is less than the grating period of the metal nano pattern.

3. The electroluminescent device of claim 1, wherein the metal nano pattern is made of at least one material selected from a group consisting of Ag, Cu, Al, Mg, Pt, Pd, Au, Ni, Nd, Ir, Cr, Na, Cs, Ba, Li, Ca, Co, and alloys thereof.

* * * * *